(12) United States Patent
Tooher et al.

(10) Patent No.: US 7,760,575 B2
(45) Date of Patent: Jul. 20, 2010

(54) MEMORY LEAKAGE CONTROL CIRCUIT AND METHOD

(75) Inventors: Michael James Tooher, Mountain View, CA (US); Prakash Ravikumar Bhatia, Fremont, CA (US)

(73) Assignee: Virage Logic Corp., Fremont, CA (US)

( * ) Notice: Subject to any disclaimer, the term of this patent is extended or adjusted under 35 U.S.C. 154(b) by 185 days.

(21) Appl. No.: 11/968,021

(22) Filed: Dec. 31, 2007

(65) Prior Publication Data

US 2009/0168497 A1 Jul. 2, 2009

(51) Int. Cl.
*G11C 5/14* (2006.01)
(52) U.S. Cl. .................. 365/226; 365/154; 365/230.03
(58) Field of Classification Search .................. 365/154, 365/156, 227, 229, 226, 195, 230.03, 230.15, 365/230.02; 713/300, 320
See application file for complete search history.

(56) References Cited

U.S. PATENT DOCUMENTS 7,149,142 B1 * 12/2006 Fisher et al. ................. 365/229
7,307,899 B2 * 12/2007 Khellah et al. .......... 365/189.11
2005/0135162 A1 * 6/2005 Somasekhar et al. ... 365/189.06

* cited by examiner

*Primary Examiner*—Pho M Luu
*Assistant Examiner*—Tha-O Bui
(74) *Attorney, Agent, or Firm*—The Danamraj Law Group, P.C.

(57) ABSTRACT

In one embodiment, a static random access memory (SRAM) is operable with first voltage and second voltages and includes a plurality of SRAM cells arranged in rows and columns, each SRAM cell being coupled to a respective wordline, respective complementary bitlines, and a source line and a control circuit connected between the source line and the second voltage. The control circuit is selectively operable in a working mode in which data in the plurality of SRAM cells can be accessed, a sleep mode is which data is retained but leakage is reduced and a shutdown mode in which the source line is allowed to float to a level that is substantially equal to the first voltage.

17 Claims, 6 Drawing Sheets

MEMORY LEAKAGE CONTROL CIRCUIT AND METHOD

BACKGROUND

1. Technical Field

The present disclosure relates generally to semiconductor memories. More particularly, and not by way of any limitation, the present disclosure is directed to a source-biasing scheme for reducing leakage in Static Random Access Memory (SRAM) cells.

2. Description of Related Art

Static Random Access Memory (SRAM) devices containing a plurality of memory cells are typically configured as an array having rows and columns, with one or more I/Os (i.e., x4, x8, x16, etc. configurations). Also, such memories may be provided in a multi-bank architecture for applications where high density, high speed, and low power are required. Regardless of the architecture and type, each SRAM cell is operable to store a single bit of information. To access this information, a memory system activates all memory cells in a given row by driving a wordline associated therewith and outputs the data onto bitlines associated with a selected column for providing the stored data value to the selected output. Once the data is disposed on the bitlines, voltage levels on the bitlines begin to separate to opposite power supply rails (e.g., $V_{DD}$ and ground), and a sense amp is utilized to latch the logic levels sensed on the bitlines after they are separated by a predetermined voltage difference, typically 10% or less of $V_{DD}$. Furthermore, the sense amp may be provided as a differential sense amp, with each of the memory cells driving both a data signal and a data-bar signal on the complementary bitlines (i.e., data lines) associated with each column.

In operation, prior to activating the memory cells, the bitlines are precharged and equalized to a common value. Once a particular row and column are selected, the memory cell corresponding thereto is activated such that it pulls one of the data lines toward ground, with the other data line remaining at the precharged level, typically $V_{DD}$. The sense amp coupled to the two complementary bitlines senses the difference between the two bitlines once it exceeds a predetermined value and the sensed difference is indicated to the sense amp as the differing logic states of "0" and "1".

As the transistor device sizes continue to decrease, e.g., 0.13μ or smaller, several issues begin to emerge with respect to the operation of SRAM cells, chiefly because at such dimensions the devices suffer from high values of leakage in the off state in standby mode. Essentially, these devices are no longer ideal switches; rather they are closer to sieves, having a non-negligible constant current flow path from drain to source or from drain/source to substrate even in the off state. The high leakage causes two major problems. First, because of the generation of large static current as leakage, there is increased static power consumption as a result. Second, which is more serious, is the issue of incorrect data reads from the SRAM cells. The accumulated leakage current from all the bitcells in a selected column is now comparable to the read current, thereby significantly eroding the bitline differential required for reliable sensing operations.

SUMMARY

In one aspect, the present disclosure is directed to a static random access memory (SRAM) operable with a first voltage and a second voltage. The SRAM comprises a plurality of SRAM cells arranged in rows and columns, with each SRAM cell coupled to a respective wordline, respective complementary bitlines, and a source line. The SRAM also comprises a control circuit connected between the source line and the second voltage, so that the control circuit is selectively operable in a working mode in which data in said plurality of SRAM cells can be accessed and is also operable in a shutdown mode in which the source line is allowed to float to a voltage level that is substantially equal to the first voltage.

In another aspect, the present disclosure is directed to a control circuit for an SRAM that is operable between a first voltage and a second voltage. The control circuit comprises a first means for selectively connecting a source line of the SRAM to the second voltage, a second means for selectively connecting the source line to a third voltage that is between the first and second voltages, and a third means for selectively allowing the source line to float to a level that is substantially equal to the first voltage.

In a further aspect, the present disclosure is directed to a memory leakage control method operable with an SRAM that operates between a first voltage and a second voltage, with the SRAM including a plurality of SRAM cells arranged in rows and columns, each SRAM cell being coupled to a respective wordline, respective complementary bitlines, and a source line. The method comprises the operations of selectively connecting the source line to the second voltage, selectively connecting the source line to a third voltage that is between the first and second voltages, and selectively allowing the source line to float to a value that is substantially equal to the first voltage.

BRIEF DESCRIPTION OF THE DRAWINGS

A more complete understanding of the present disclosure may be had by reference to the following Detailed Description when taken in conjunction with the accompanying drawings wherein.

DETAILED DESCRIPTION OF THE DRAWINGS

Figure 1:
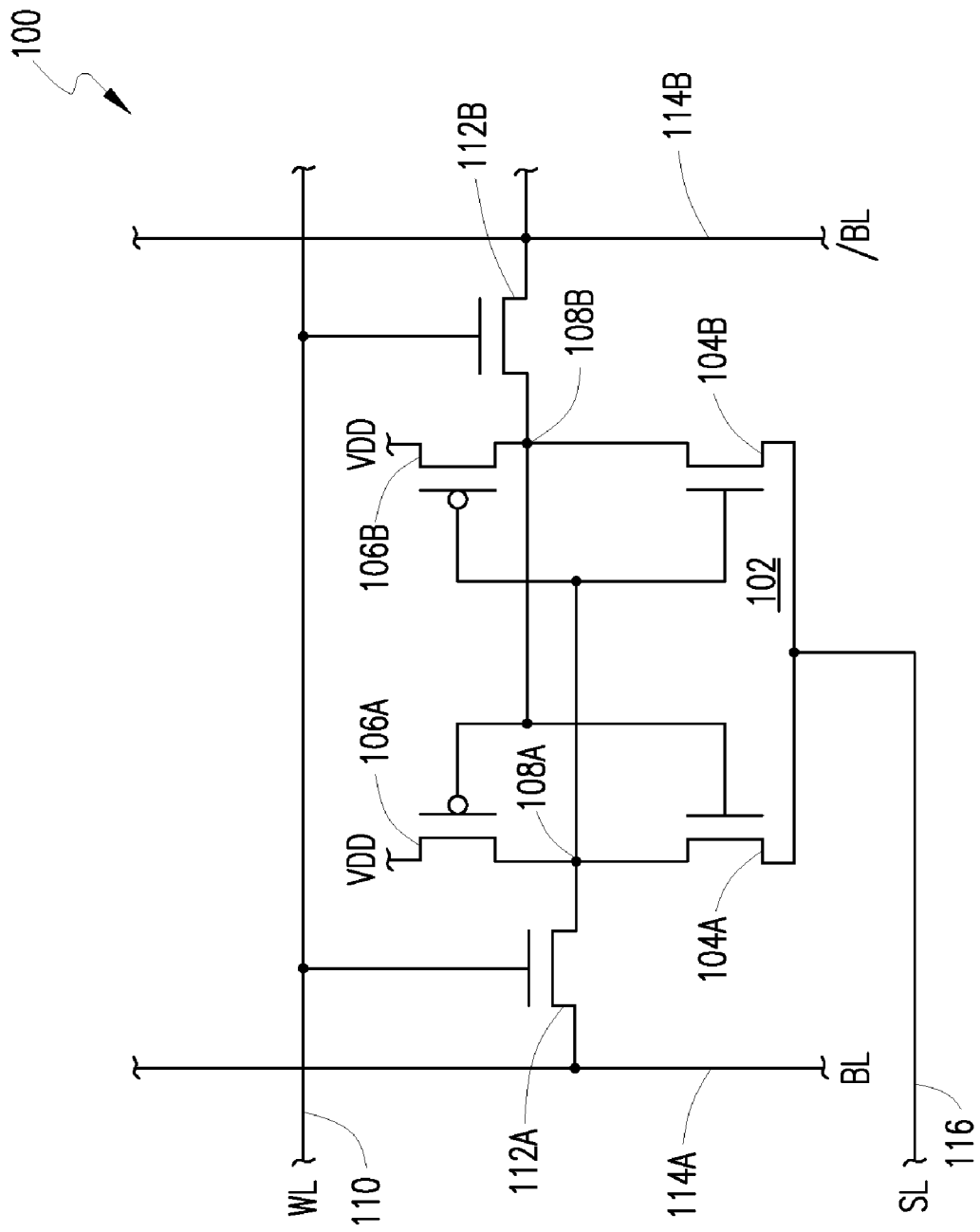
FIG. 1 depicts an exemplary embodiment of a source-biased SRAM cell in accordance with the teachings of the present patent application.

In the drawings, like or similar elements are designated with identical reference numerals throughout the several views thereof, and the various elements depicted are not necessarily drawn to scale. Referring now to FIG. 1, depicted therein is an exemplary embodiment of a source-biased SRAM cell 100 in accordance with the teachings of the present disclosure wherein leakage may be advantageously reduced without disturbing the integrity of stored data and wherein leakage may be further reduced when the retention of stored data is not a concern. As illustrated, SRAM cell 100 is provided with a pair of complementary bitlines, BL 114A and /BL 114B where each of the complementary bitlines may be coupled to appropriate precharge circuitry (not shown in this Figure) such that it is pulled to a power supply rail or a reference voltage source (typically $V_{DD}$ or any portion thereof) when the precharge circuitry is activated.

The memory cell 100, also referred to as a bitcell, comprises a 4T-CMOS latch 102 that includes a pair of cross-coupled inverters to form a pair of data nodes 108A and 108B. A first P-channel field effect transistor (P-FET) 106A operating as a pull-up device of one of the inverters has its source/drain terminals connected between $V_{DD}$ and first data node 108A, with the gate thereof connected to second data node 108B. As is well known, the data nodes 108A and 108B operate as the two complementary storage nodes in the memory cell 100. An N-channel FET (N-FET) 104A operating as a pull-down device has its drain connected to data node 108A and its source connected to a source bias control line (SL) 116 that is switchably connected to a bias potential as will be described in greater detail hereinbelow. The gate of N-FET 104A is coupled to second data node 108B. With respect to the other inverter, a second P-FET 106B is operable as a pull-up device having its source/drain terminals connected between $V_{DD}$ and data node 108B, with the gate thereof connected to data node 108A. A second N-FET 104B is operable as a pull-down device wherein the drain is coupled to data node 108B and the source is commonly connected to source bias control line 116.

A first N-FET access device 112A is disposed between BL 114A and data node 108A, with the gate thereof coupled to wordline (WL) 110. In similar fashion, a second N-FET access device 112B has the source/drain thereof connected between /BL 114B and data node 108B, wherein its gate is also driven by WL 110. The cross-coupled inverters of the memory cell form latch 102, where nodes 108A and 108B are operable to hold logic levels that correspond to stored data.

In one embodiment of a memory standby mode, WL 110 is held low and the precharge circuitry associated with the bitlines is activated so as to pull the bitlines to a predetermined high voltage. Further, SL 116 is raised to a select potential (having a range approximately from around 100 millivolts to 300 millivolts, the value being determined such that the logic levels that correspond to stored data at nodes 108A and 108B are not disturbed, which depends on the SRAM cell technology, operating voltage levels, device sizing, et cetera). Because of the biasing of the sources of the N-FET pull-down devices 104A and 104B by SL 116, both the gate leakage and sub-threshold leakage through bitcell 100 is significantly reduced.

In one embodiment of a memory shutdown mode, WL 100 is held low and the precharge circuitry associated with the bitlines is activated so as to pull the bitlines to the predetermined high voltage. In shutdown mode, source line SL 116 is isolated from the source voltage and is allowed to float. Due to leakage in bitcell 100 and the other bitcells connected to the source line, the voltage on source line 116 will float up until it stabilizes at a point at or near $V_{DD}$. When SL 116 stabilizes, there will be essentially no gradient across bitcell 100, so further leakage will be minimized. In this state, it will be understood that the ability to store differential values in latch 102 can be impaired and any stored data will be lost.

Figure 2:
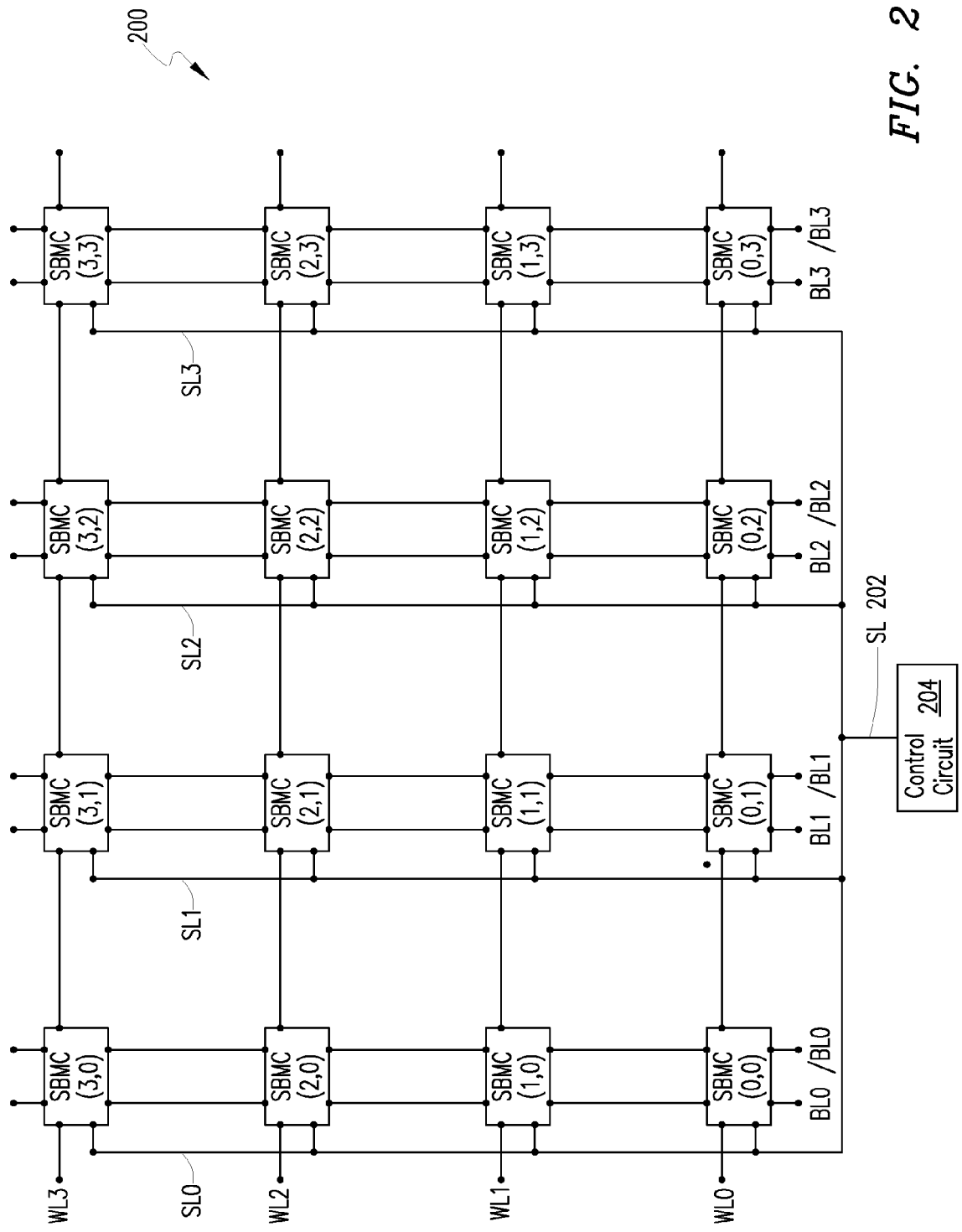
FIG. 2 depicts an exemplary memory array portion comprising source-biased SRAM cells according one embodiment of the present patent application.

FIG. 2 depicts an exemplary SRAM array portion 200 comprising source-biased memory cells (SBMCs) according to one embodiment of the present disclosure. As illustrated, 16 bitcells, SBMC(0,0) to SBMC(3,3), are disposed in a 4-by-4 array, where bitcells of each row are associated with a respective WL corresponding to the row. In FIG. 2, SL0 to SL3 exemplify four commonly coupled source bias control lines, each operating with respect to a particular column of bitcells. Coupled to source line 202 is control circuit 204, which may selectively connect SL 202 and SRAM array portion 200 to the lower power rail or to a voltage that is above the lower power rail. Control circuit 204 may also selectively isolate SL 202 from either of these voltage sources.

Figure 3:
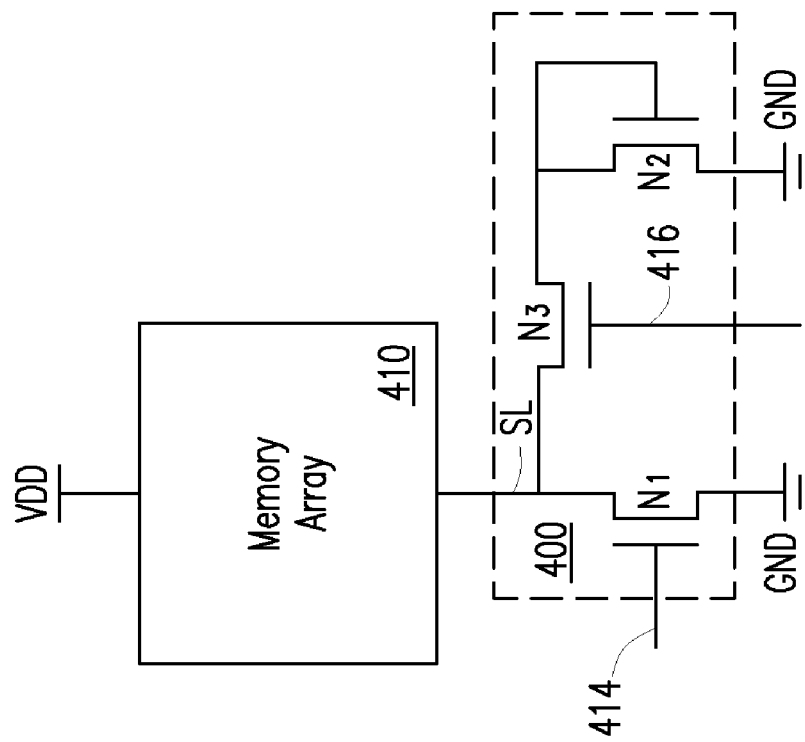
FIG. 3 depicts a memory leakage control circuit for a memory core.

FIG. 3 depicts a leakage control circuit 300 for a memory array 310. Memory array 310 is a static random access memory and can be organized in rows and columns, such as is shown in the exemplary memory of FIG. 2. As illustrated, leakage control circuit 300 is divided into two sections, 300A and 300B. Section 300A of the leakage control circuit contains P-FET P1 and is connected between memory array 310 and the upper supply rail that is generally designated $V_{DD}$. In order to provide $V_{DD}$ to memory array 310, P1 is typically implemented as a large transistor. Additionally, although P1 is shown as a single P-FET, an implementation of this circuit may be realized as an array of P-FETs, connected as necessary to supply $V_{DD}$ to the entire memory array. For example, a row of P-FETS may be connected in parallel, each providing $V_{DD}$ to a portion of memory 310. A second section 300B of the leakage control circuit contains two N-FETs, N1 and N2. Transistor N1 is connected to the source line SL of the memory array and to the lower power rail, such as ground. Transistor N2 is also connected to the source line of the memory array and to the lower power rail, but in N2, the gate and drain of the transistor are connected to each other so that N2 acts as a diode.

In operation, when signal 312 is high so that P1 is turned off, no power is available to memory array 310 and the memory is in shutdown mode, with no ability to retain data. When signal 312 is low so that transistor P1 is on, memory array 310 receives power and has the capability of retaining any data that is stored therein. Additionally, depending on the connection to the lower power rail, memory array 310 may also have the capability of reading and writing data. When signal 312 is held low and signal 314 goes high, transistors N1 and P1 are both on and memory array 310 is connected to both $V_{DD}$ and ground. This provides the full voltage drop across the memory array, allowing data to be read from and written to the cells of the array in a working mode. Although data is optimally retained in this mode, leakage across memory array 310 is at its highest level. Finally, when both signals 312, 314 are low, so that P1 is on but N1 is off, the voltage on the source line, and thus on the drain of transistor N2, will rise toward $V_{DD}$. Transistor N2 acts as a diode, so that once the voltage on SL reaches a value equal to the threshold value VT of transistor N2, this transistor will turn on, holding the voltage on the source line at a value of approximately VT. This provides a sleep mode in which the difference between $V_{DD}$ and the voltage on the source line is reduced, effectuating a drop in leakage across the storage transistors of each bitcell.

Although only one each of transistors N1 and N2 are shown in the Figure, each of these transistors may be replicated as multiple N-FET devices in a row. For example, the source line of a plurality of columns of array 310 may be connected together as a set as shown in FIG. 2, with each set being connected to a separate control circuit 300B. One skilled in the art would understand that circuit 300B may be implemented in a number of ways according to the requirements of the specific memory (e.g., I/O configuration, column banking, row banking, etc.).

Figure 4:
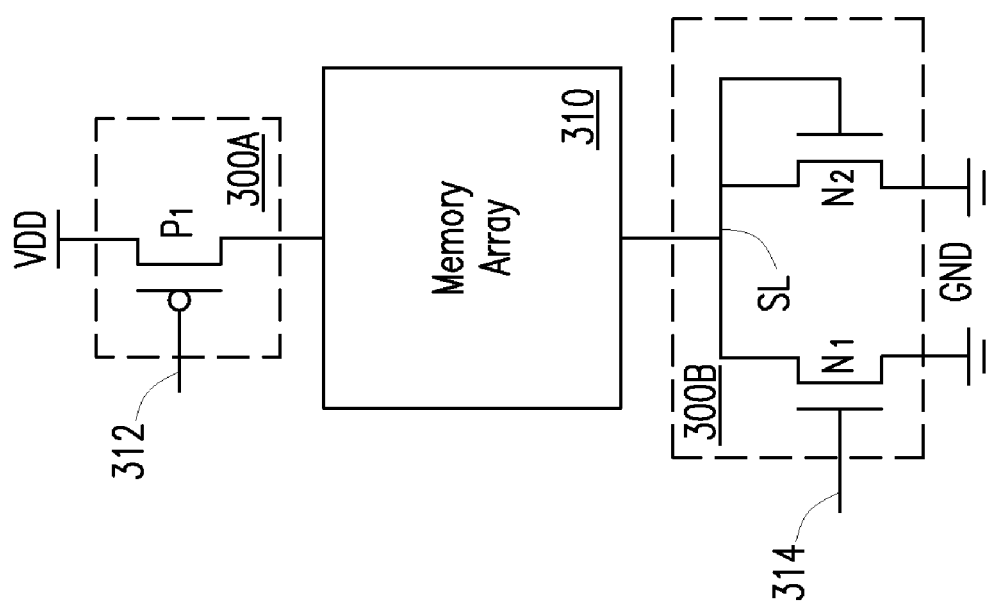
FIG. 4 depicts a memory leakage control circuit for a memory core in accordance with the teachings of the present patent application.

FIG. 4 depicts a memory array 410 that operates between a first voltage, generally denoted $V_{DD}$, and a second voltage, generally denoted GND, in accordance with another embodiment of the present patent application. It will be understood that although the second voltage may be a connection to ground, memory array 410 can be operated with first and second voltages that do not include ground, but which provide the necessary voltage difference to store information in the bitcells. Memory array 410 is connected to memory leakage control circuit 400. In one embodiment, memory array 410 can be an SRAM, with SRAM bitcells arranged in rows and columns and with each bitcell connected to a corresponding wordline and to a pair of complementary bitlines. A common source line may connect a number of bitcells together, along the rows or the columns, e.g., as shown in FIG. 2. In the embodiment illustrated, memory array 410 is connected to $V_{DD}$, preferably without an intervening P-FET. The leakage control circuit 400 is connected between memory array 410 and the lower power rail, shown here as the ground connection GND. In one embodiment, leakage control circuit 400 advantageously contains three transistors, all of these being N-FET devices. The N-FETs forming leakage control circuit 400 may require less area on the chip than a design using both N-FETs and P-FETs, such as, for example, the embodiment shown in FIG. 3. Transistor N1 is connected between the memory array 410 and the ground connection GND and is controlled by signal 414. Transistors N2 and N3 are connected generally in series between memory array 410 and the ground connection GND. The gate of transistor N3 is controlled by signal 416, while the gate and drain of transistor N2 are connected together.

In operation, memory array 410 is in a working mode when signal 414 is high, turning on transistor N1, with suitable first and second voltages being applied. This connects source line SL to ground and provides the necessary voltage gradient across the memory array. In the working mode, data can be read from and written to memory array 410 and will be optimally retained, but leakage is high due to the differential across the transistors. Thus, transistor N1 forms a means for selectively connecting the source line to the second voltage.

A sleep mode is operative when signal 414 is low and signal 416 is high, turning off transistor N1 and turning on transistor N3. As the circuit moves from working mode to sleep mode, the voltage on SL can rise, due to leakage across the array, until the voltage is approximately the threshold voltage VT of transistor N2, at which point N2 will turn on. Alternatively, further circuitry may be added to drive SL to the value of VT more quickly. As in circuit 300B, N2 acts as a diode and will hold the voltage on the source line SL at approximately VT, i.e., a diode drop above ground. Thus, transistors N2 and N3 provide a means for selectively connecting the source line to a third voltage that is between the first and second voltages. In one embodiment, the first voltage is equal to 1.2 volts, the second voltage is 0 volts, and the third voltage is 0.6 volts. In sleep mode, data is retained in the bitcells and the leakage is significantly reduced, although no data can be read or written.

A shutdown mode is operative when both signals 414, 416 are low, turning off transistors N1 and N2. Memory array 410 is isolated from the second voltage. In a shutdown mode, source line SL can float, due to cell leakage, to a level at or near $V_{DD}$. As the voltage on SL approaches $V_{DD}$, little or no gradient exists to drive further leakage current and the leakage drops to near zero. At the same time the bitcells will lose their ability to store information and all data will be lost. Thus, transistors N1 and N3 provide a means for selectively allowing the source line to float to the level of the first voltage.

Figure 5:
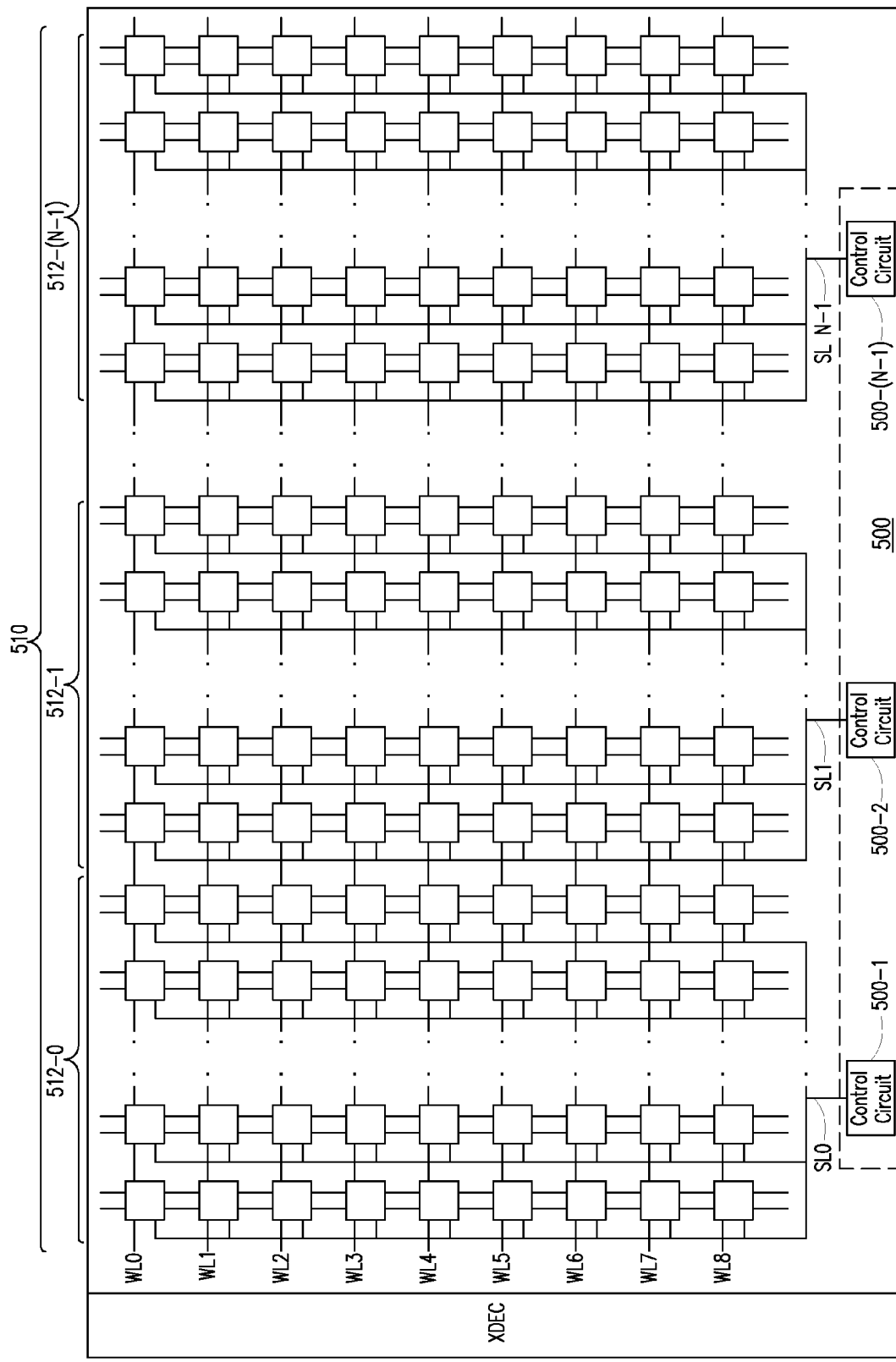
FIG. 5 depicts an exemplary memory array and control circuit in accordance with one embodiment of the present patent application.
Figure 6:
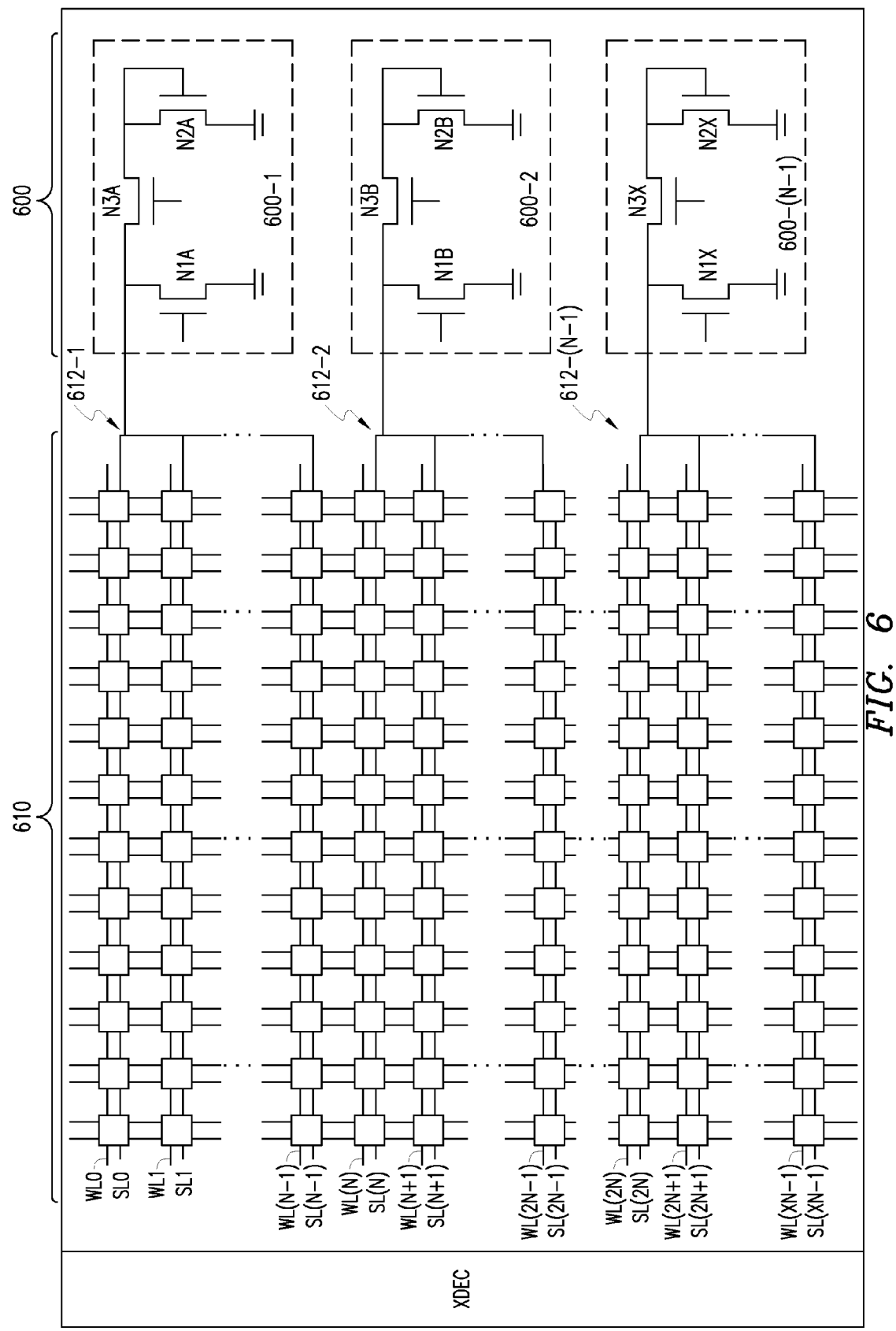
FIG. 6 depicts an exemplary memory array and control circuit in accordance with one embodiment of the present patent application.

Although control circuit 400 is shown as a single circuit of three transistors attached to source line SL, there is generally a need for more than a single control circuit to provide connection to the lower power rail. In practice, memory array 410 may be sub-divided into groups of cells, with each group of cells having a common source line connected to a respective control circuit. FIG. 2 discloses one such possibility in which the source lines of four columns of the memory are connected together and served by control circuit 204. FIGS. 5 and 6 disclose other possible arrangements.

With reference to FIG. 5, a memory array 510 and control circuit 500 are depicted according to one embodiment of the disclosure, with each bitcell depicted by a square having connections to a wordline, complementary bitlines, and a source line. Memory array 510 is configured with a specific I/O basis, i.e., the number of bits read or written with each memory operation, generally 4, 8, 16, 32, 64, etc. The memory array is logically divided into groups of columns 512-0 through 512-(N−1), with each group 512-x containing a number of columns according to the I/O basis. In this embodiment, a respective control circuit 500-x is connected to the source line of each group 512-x, thereby forming global control circuitry 500 for the entire array 510.

With reference to FIG. 6, a memory array 610 and control circuit 600 are depicted according to one embodiment of the disclosure. In this embodiment, memory array 610 is organized as multiple banks 612-0 through 612-(N−1), with each bank containing multiple rows of SRAM cells, e.g., 128, 256, 512 or 1024 rows, etc. Within each bank 612-x, the source lines for all bitcells are connected together and this common source line is connected to a respective control circuit 600-x. One skilled in the art will understand that the arrangement of memory and control circuits in each of these exemplary embodiments are for illustration only.

Figure 7:
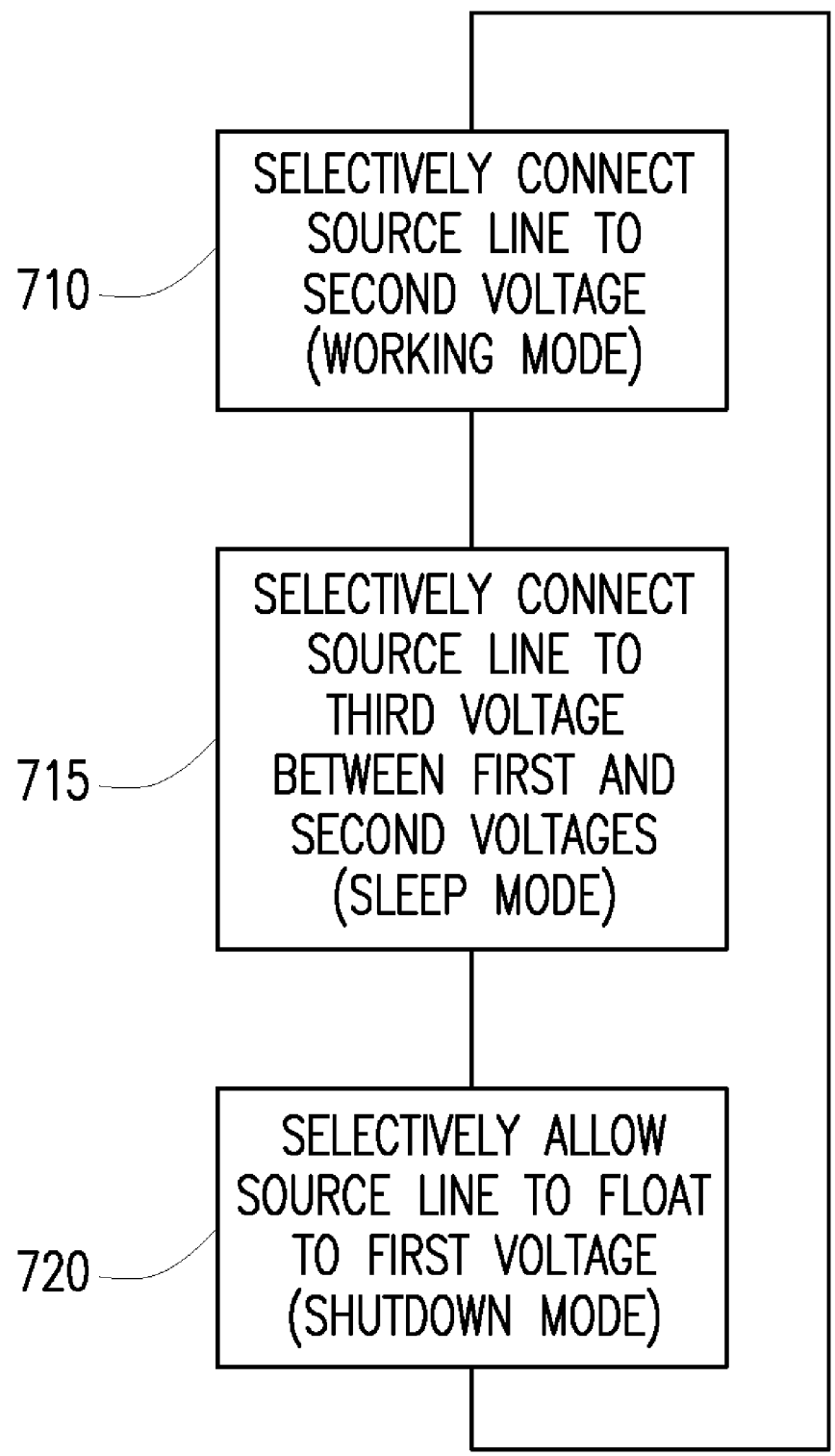
FIG. 7 depicts a memory leakage control method in accordance with one embodiment of the present patent application.

Turning to FIG. 7, a memory leakage control method operable with an SRAM that operates between a first voltage and a second voltage is depicted in accordance with one embodiment of the present patent application, wherein each SRAM cell is coupled to a respective wordline, respective complementary bitlines, and a source line. In block 710, the source line is selectively connected to the second voltage, e.g., to ground. This provides the working mode discussed above. Similarly, in block 715, the source line is selectively connected to a third voltage that is between the first and second voltages. The third voltage may be, for example, a diode voltage drop above the second voltage. Connection to this third voltage provides the sleep mode. Likewise, in block 720, the source line is selectively isolated from the second voltage, allowing the source line to float to a value or level that is equal or substantially equal to the first voltage, providing the shutdown mode. Although these blocks are shown sequentially, there is no specific order in which they are performed. Rather, the method may respond to the specific conditions present in a memory circuit to provide the desired functional mode or state therein. Further, although an embodiment of the control circuit having all N-FETs has been described in detail hereinabove, it should be appreciated that in certain arrangements, an all P-FET design may be implemented with suitable signal logic for providing appropriate functional modes.

It is believed that the operation and construction of the embodiments of the present disclosure will be apparent from the foregoing Detailed Description. It should be readily understood that various changes and modifications could be made therein without departing from the scope of the present disclosure as set forth in the following claims.

What is claimed is:

1. A static random access memory (SRAM) operable with a first voltage and a second voltage, said SRAM comprising:
   a plurality of SRAM cells arranged in rows and columns, each SRAM cell being coupled to a respective wordline, respective complementary bitlines, and a source line; and
   a control circuit connected between said source line and said second voltage, wherein said control circuit is selectively operable in a working mode in which said source line is connected to said second voltage such that data in said plurality of SRAM cells can be accessed, a sleep mode in which said source line is connected to a third voltage that is between said first voltage and said second voltage such that data is retained while leakage within said SRAM is decreased, and a shutdown mode in which said source line is isolated from said second voltage and said third voltage and is allowed to float to a level that is substantially equal to said first voltage.

2. The static random access memory according to claim 1, wherein said control circuit comprises three N-channel transistors.

3. The static random access memory according to claim 1, wherein said control circuit comprises a first transistor that is connected to said second voltage and to said source line and a second transistor that is connected to said second voltage and is connected to said source line through a third transistor.

4. The static random access memory according to claim 3, wherein a gate and a drain of said second transistor are connected together.

5. The static random access memory according to claim 1, wherein in said sleep mode, said source line stabilizes at substantially a diode drop above said second voltage.

6. The static random access memory according to claim 1, wherein said SRAM is divided into a plurality of banks of cells, each bank being connected to a respective source line and a respective control circuit.

7. The static random access memory according to claim 1, wherein said source line and said control circuit are connected to n columns of said memory on a per input/output (I/O) basis.

8. The static random access memory according to claim 7, wherein said n is selected from 4, 8, 16, 32, and 64 columns.

9. The static random access memory according to claim 1, wherein said second voltage comprises 0 volts.

10. A control circuit for a static random access memory (SRAM) that is operable between a first voltage and a second voltage, said control circuit comprising:
   a first component configured to connect a source line of said SRAM to said second voltage during a working mode; and
   a second component configured to connect said source line to a third voltage that is between said first voltage and said second voltage during a sleep mode;
   wherein in a shutdown mode said source line is allowed to float to a level that is substantially equal to said first voltage.

11. The control circuit for an SRAM according to claim 10, wherein said first component comprises a first N-channel transistor.

12. The control circuit for an SRAM according to claim 11, wherein said second component comprises second and third N-channel transistors, said second N-channel transistor being connected to said second voltage and being connected to said source line through said third N-channel transistor.

13. The control circuit for an SRAM according to claim 12, wherein a gate and a drain of said second N-channel transistor are connected together.

14. The control circuit for an SRAM according to claim 10, wherein said third voltage is approximately a diode drop above said second voltage.

15. A memory leakage control method operable with a static random access memory (SRAM) that operates between a first voltage and a second voltage, said SRAM comprising a plurality of SRAM cells arranged in rows and columns, each SRAM cell being coupled to a respective wordline, respective complementary bitlines, and a source line, said method comprising:
   selectively connecting said source line to said second voltage in a working mode;
   selectively connecting said source line to a third voltage that is between said first voltage and said second voltage in a sleep mode; and
   selectively isolating said source line from said second voltage and said third voltage and allowing said source line to float to a value substantially equal to said first voltage in a shutdown mode.

16. The memory leakage control method according to claim 15, wherein selectively connecting said source line to a third voltage comprises connecting said source line to ground through a transistor connected to operate like a diode.

17. The memory leakage control method according to claim 15, wherein selectively connecting said source line to said second voltage comprises turning on an N-channel field effect transistor connected between said source line and said second voltage.

* * * * *